United States Patent [19]

Ishikawa et al.

[11] Patent Number: 4,963,458
[45] Date of Patent: Oct. 16, 1990

[54] IMAGE FORMING METHOD AND MATERIAL USING PHOTOPOLYMERIZABLE COMPOSITION

[75] Inventors: Shunichi Ishikawa; Fumiaki Shinozaki, both of Kanagawa, Japan

[73] Assignee: Fuji Photo Film Co., Ltd., Kanagawa, Japan

[21] Appl. No.: 240,327

[22] Filed: Sep. 6, 1988

[30] Foreign Application Priority Data

Sep. 3, 1987 [JP] Japan .................. 62-220795

[51] Int. Cl.⁵ .......................... G03C 1/72; G03C 8/00
[52] U.S. Cl. ..................................... 430/138; 430/200; 430/254; 430/328; 430/330; 430/348; 430/349; 430/293; 430/964; 503/214
[58] Field of Search ............... 430/138, 325, 330, 200, 430/327, 917, 349, 254, 328, 348, 350; 503/214

[56] References Cited

U.S. PATENT DOCUMENTS

| | | | |
|---|---|---|---|
| 4,149,887 | 4/1979 | Levy | 430/138 |
| 4,399,209 | 8/1983 | Sanders et al. | 430/138 |
| 4,529,681 | 7/1985 | Usami et al. | 430/138 |
| 4,562,137 | 12/1985 | Sanders | 430/138 |
| 4,636,453 | 1/1987 | Keys et al. | 430/138 |
| 4,663,266 | 5/1987 | Adain et al. | 430/138 |
| 4,687,725 | 8/1987 | Wright et al. | 430/138 |
| 4,755,445 | 7/1988 | Hasegawa | 430/138 |
| 4,755,446 | 7/1988 | Keys et al. | 430/138 |
| 4,766,037 | 8/1988 | Watanabe et al. | 428/402.21 |
| 4,816,371 | 3/1989 | Wright et al. | 430/138 |
| 4,873,168 | 10/1989 | Ruder et al. | 430/203 |

FOREIGN PATENT DOCUMENTS 812181 5/1969 Canada ...................... 430/350
62-60694 3/1987 Japan .

Primary Examiner—Marion C. McCamish
Assistant Examiner—Christopher D. Rodee
Attorney, Agent, or Firm—Sughrue, Mion, Zinn, Macpeak & Seas

[57] ABSTRACT

A light-sensitive image forming method using a recording element which comprises a recording layer on a support is disclosed. The recording layer contains at least two active components of a photopolymerizable composition such as a polymerizable compound and a polymerization initiator, both of which are essential for a photopolymerization reaction. The components are separated from each other by the shell of microcapsules in such manner that at least one component is contained in the microcapsules which are dispersed in the recording layer and the other component is arranged outside of the microcapsule. The image forming method comprises the steps of: heating the recording element to form the photopolymerizable composition in the recording layer; and imagewise exposing to light the recording element to imagewise polymerize the photopolymerizable composition. When the recording element is heated, the component outside of the microcapsules are brought into contact with the component in the microcapsules by permeation of at least one of the components through the shell of the microcapsules. Heat-sensitive image forming methods are also disclosed.

33 Claims, 4 Drawing Sheets

IMAGE FORMING METHOD AND MATERIAL USING PHOTOPOLYMERIZABLE COMPOSITION

FIELD OF THE INVENTION

This invention relates to a light-sensitive image forming method using a photopolymerizable composition. The invention also relates to heat-sensitive image forming methods using the photopolymerizable composition.

BACKGROUND OF THE INVENTION

A recording element comprising a photopolymerizable composition on a support is already known, and has been mainly used as a presensitized printing plate. The recording element is usually used in an image forming method which comprises the steps of: imagewise exposing to light the recording element to polymerize the photopolymerizable composition within the exposed area; and washing the element with a solvent to remove the unpolymerized photopolymerizable composition.

U.S. Pat. Nos. 4,399,209, 4,440,846 and 4,663,266 disclose improved recording elements, in which a photopolymerizable composition is contained in microcapsules which are dispersed in a recording layer. The recording element employing the microcapsules can be used in an image forming method which comprises the steps of: imagewise exposing to light the recording element to polymerize the photopolymerizable composition within the exposed area; and pressing the recording element to rupture the microcapsules containing the unpolymerized photopolymerizable composition. This image forming method contains no process of washing the element with a solvent. It is advantageous for the recording element employing microcapsules to give an image only by the dry process.

However, in the recording element employing the microcapsules, the active components of a photopolymerizable composition such as a polymerizable compound and a photopolymerization initiator are together contained in the microcapsules. If the recording element is exposed to light by accident, the exposed element is of no use, since a polymerization reaction has been initiated with light. There is another problem that where the active components are arranged in contact with each other, they tend to be inactivated. For example, where a photopolymerization initiator is dissolved in a polymerizable compound, the initiator gradually precipitates from the polymerizable compound and is then inactivated.

U.S. Pat. No. 4,636,453 (Keys et al.) discloses a photopolymerizable element comprising a support, a photopolymerizable composition layer and a protective layer. In the photopolymerizable composition layer, pressure rupturable microcapsules containing at least one active component for the photopolymerizable composition are dispersed. In other words, the photopolymerizable layer contains at least two active components of a photopolymerizable composition, said components being separated from each other by the shell of microcapsules in such manner that at least one component is contained in the microcapsules and the other component is arranged outside of the microcapsules.

FIG. 4 is a sectional view schematically illustrating an embodiment of the photopolymerizable element disclosed in U.S. Pat. No. 4,636,453.

As is shown in FIG. 4, the photopolymerizable element comprises a support (41), a photopolymerizable composition layer (43) and a protective layer (44). A polymerizable compound is contained in microcapsules (42) which are dispersed in the composition layer (43). A photopolymerization initiator (o) is arranged outside of the microcapsules (42).

The photopolymerizable element disclosed in U.S. Pat. No. 4,636,453 is used in an image forming method which comprises the steps of: pressing the element to form the photopolymerizable composition in the composition layer, said composition being formed by the rupture of the microcapsules; imagewise exposing to light the element to polymerize the photopolymerizable composition within the exposed area; and washing the element with a solvent to remove the unpolymerized photopolymerizable composition.

FIG. 4-A is a sectional view schematically illustrating the process for pressing the element.

As is shown in FIG. 4-A, the element is pressed to rupture the microcapsules (45). Thus, the photopolymerization initiator (o) is mixed with the polymerizable compound contained in the microcapsules to form a photopolymerizable composition.

FIG. 4-B is a sectional view schematically illustrating the process for imagewise exposing to light the element.

As is shown in FIG. 4-B, the photopolymerizable composition is polymerized within the exposed area (46), while the photopolymerizable composition is not polymerized within the other area (47).

FIG. 4-C is a sectional view schematically illustrating the process for washing the element with a solvent.

As is shown in FIG. 4-C, the unpolymerized photopolymerizable composition is removed by the solvent. Thus, a polymer image (48) is obtained.

In this photopolymerizable element, the active components of a photopolymerizable composition are separated from each other by the shell of the microcapsules. Accordingly, even if the element is exposed to light by accident, no polymerization reaction is initiated with light. Therefore, the above-mentioned problems of the recording element which employs the microcapsules containing all of active components of a photopolymerizable composition have been solved by the use of this element.

But, according to the image forming method disclosed in U.S. Pat. No. 4,636,453, the element should be pressed to rupture all of the microcapsules prior to the process for imagewise exposing to light the element. Accordingly, the method should contain a wet process for washing the element with a solvent. In other words, this image forming method loses the merit of the microcapsules (i.e., dry process) mentioned in U.S. Pat. Nos. 4,399,209, 4,440,846 and 4,663,266.

SUMMARY OF THE INVENTION

An object of the present invention is to provide a new image forming method which gives an image only by a dry process.

Another object of the invention is to provide a new image forming method which uses a recording element improved in the stability.

A further object of the invention to provide entirely new heat-sensitive image forming methods which use a photopolymerizable composition.

A still further object of the invention is to provide a new heat-sensitive recording element.

There is provided by the present invention an image forming method using a recording element which comprises a recording layer on a support, said recording layer containing at least two active components of a photopolymerizable composition, and said components being separated from each other by the shell of microcapsules in such manner that at least one component is contained in the microcapsules which are dispersed in the recording layer and the other component is arranged outside of the microcapsules, wherein the image forming method comprises the steps of:

heating the recording element to bring the component outside of the microcapsules into contact with the component in the microcapsules (a photopolymerizable composition is formed in the recording layer by permeation of at least one of the separated components through the shell of the microcapsules); and simultaneously or thereafter imagewise exposing to light the recording element to imagewise polymerize the photopolymerizable composition.

The present inventors have found that a photopolymerizable composition can be formed in the recording element disclosed in U.S. Pat. No. 4,636,453 without rupturing microcapsules by using a new process. The new process is the step of heating the recording element. When the recording element is heated, at least one of the separated components permeates through the shell of the microcapsules to form the photopolymerizable composition in the recording layer.

According to the image forming method of the present invention, the microcapsule structure of the recording element remains after the element is heated to form the photopolymerizable composition. Accordingly, the heated recording element can give an image only by a dry process. Therefore, in contrast with the image forming method disclosed in U.S. Pat. No. 4,636,453, the method of the invention has the merit of the microcapsules (i.e., dry process) mentioned in U.S. Pat. Nos. 4,399,209, 4,440,846 and 4,663,266.

Further, in the recording element used in the present invention, the active components of photopolymerizable composition are separated from each other by the shell of microcapsules in such manner that at least one component is contained in the microcapsules and the other component is arranged outside of the microcapsules. Accordingly, even if the element is exposed to light by accident, no polymerization reaction is initiated with light. Therefore, the image forming method of the present invention also has the merit (i.e., improved stability) of the recording element disclosed in U.S. Pat. No. 4,636,453.

Furthermore, according to the image forming method of the present invention, there is no need of providing a protective layer on the recording layer. In the image forming method disclosed in U.S. Pat. No. 4,636,453, the photopolymerizable element is pressed prior to the process for imagewise exposing to light the element. Therefore, a protective layer should be provided on the photopolymerizable composition layer. The protective layer inevitably reduces the sensitivity of the element, even if the layer is made of a transparent material. Further, the protective layer should be removed prior to the process for washing the element with a solvent. In contrast to the method disclosed in U.S. Pat. No. 4,636,453, our image forming method is free from the problems of the protective layer.

There is further provided by the invention an image forming method using a recording element which comprises a recording layer on a support, said recording layer containing at least two active components of a photopolymerizable composition, and said components being separated from each other by the shell of microcapsules in such manner that at least one component is contained in the microcapsules which are dispersed in the recording layer and the other component is arranged outside of the microcapsules, wherein the image forming method comprises the steps of:

imagewise heating the recording element to bring the component outside of the microcapsules into contact with the component in the microcapsules (a photopolymerizable composition is imagewise formed in the recording layer by permeation of at least one of the separated components through the shell of the microcapsules); and simultaneously or thereafter exposing to light the recording element to polymerize the photopolymerizable composition within the heated area.

There is furthermore provided by the invention an image forming method using a recording element which comprises a recording layer on a support, said recording layer containing a photopolymerizable composition and a polymerization inhibitor, and said composition and inhibitor being separated from each other by the shell of microcapsules in such manner that one is contained in the microcapsules which are dispersed in the recording layer and the other is arranged outside of the microcapsules, wherein the image forming method comprises the steps of:

imagewise heating the recording element to bring the polymerization inhibitor into contact with the photopolymerizable composition (the photopolymerizable composition is imagewise mixed with the polymerization inhibitor by permeation of at least one of the composition and inhibitor through the shell of the microcapsules); and simultaneously or thereafter exposing to light the recording element to polymerize the photopolymerizable composition without the heated area.

These two methods are entirely new heat-sensitive image forming method. There has not yet been proposed a heat-sensitive image forming method wherein a polymerizable compound is imagewise polymerized within or without the heated area.

These new heat-sensitive image forming methods can be advantageously used in various technical fields such as monochromatic or color printing, radiography, diagnosis and copy (e.g., computer-graphic hard copy). Conventional heat-sensitive recording materials containing no polymerizable compound can not be used in most of these technical fields.

BRIEF DESCRIPTION OF THE DRAWINGS

FIG. 1-A is a sectional view schematically illustrating the process for heating the element.

FIG. 1-B is a sectional view schematically illustrating the process for imagewise exposing to light the element.

FIG. 1-C is a sectional view schematically illustrating the process for pressing the element on an image-receiving element.

FIG. 2-A is a sectional view schematically illustrating the process for imagewise heating the element.

FIG. 2-B is a sectional view schematically illustrating the process for exposing to light the element.

FIG. 2-C is a sectional view schematically illustrating the process for pressing the element on an image-receiving element.

FIG. 3-A is a sectional view schematically illustrating the process for imagewise heating the element.

FIG. 3-B is a sectional view schematically illustrating the process for exposing to light the element.

FIG. 3-C is a sectional view schematically illustrating the process for pressing the element on an image-receiving element.

FIG. 4-A is a sectional view schematically illustrating the process for pressing the element.

FIG. 4-B is a sectional view schematically illustrating the process for imagewise exposing to light the element.

FIG. 4-C is a sectional view schematically illustrating the process for washing the element with a solvent.

DETAILED DESCRIPTION OF THE INVENTION

Figure 1:
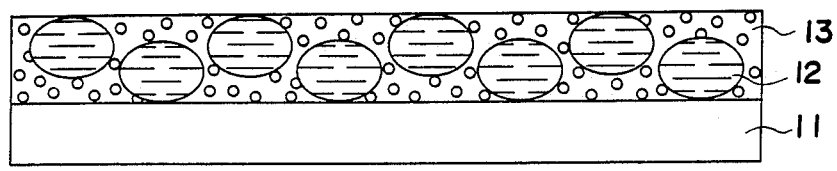
FIG. 1 is a sectional view schematically illustrating a recording element which can be used in the first embodiment of the image forming method of the present invention.
Figure 1:
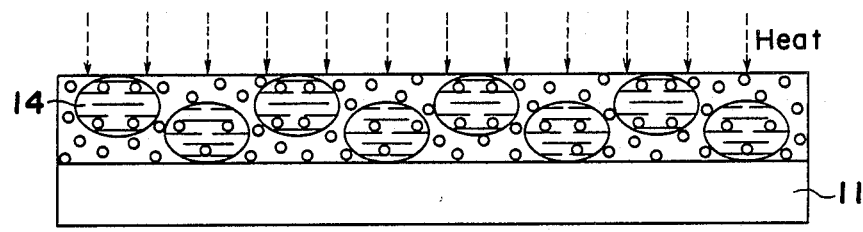
Figure 1:
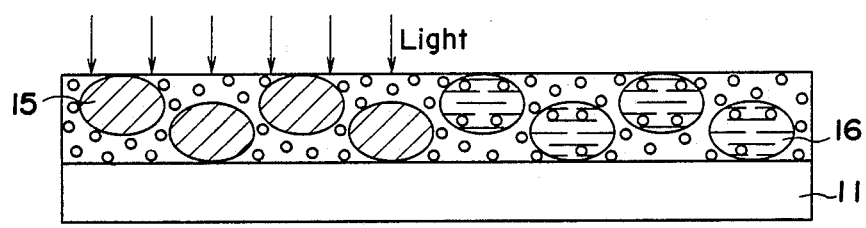
Figure 1:
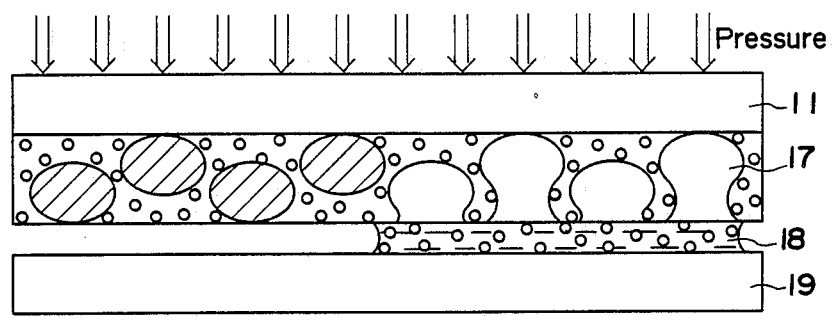

In the first embodiment of the image forming method of the present invention, the recording element is uniformly heated all over the recording layer.

There is no specific limitation with respect to heating means. For example, the recording element can be directly heated on a hot plate, drums or heated rollers. The recording element can also be heated using heated air or an infrared heater. Further, a conductive layer comprising conductive particles such as carbon black or graphite, (i.e., a conductive film) can be provided in the recording element. When electricity is passed through the conductive layer to generate Joule's heat, the recording layer is heated.

The recording element is preferably heated at a temperature of 70° to 300° C., and more preferably heated at a temperature of 80° to 200° C.

In the second and third embodiment of the method of the invention, the recording element is imagewise heated.

The recording element can be imagewise heated using various means such as a heated stamp, a thermal head and a laser beam.

The recording element is preferably imagewise heated at a temperature of 70° to 500° C.

In the first embodiment of the image forming method of the present invention, simultaneously with or after heating the recording element, the element is imagewise exposed to light.

In the second and third embodiments of the method of the invention, simultaneously with or after imagewise heating the recording element, the element is uniformly exposed to light all over the recording layer.

Various exposure means can be employed in the present invention and in general, conventional light sources can be used. Examples of the light sources include sunlight, flash light sources (e.g., an electronic flash and a flash bulb), a tungsten lamp, a mercury lamp, a halogen lamp (e.g., an iodine lamp), a xenon lamp, a laser beam, CRT (cathode ray tube), a plasma light source, a fluorrescent lamp and a light-emitting diode. Further, a combination of a micro shutter array utilizing LCD (liquid crystal display) or PLZT (lanthanum-doped lead titanate zirconate) and linear or plane light source can also be used.

In the above-mentioned process, the photopolymerizable composition contained in the microcapsules is imagewise polymerized, so that a polymer image is formed in the recording layer. A pigment image can be obtained by fixing pigments onto the polymer image.

Alternatively, the recording element can be washed with a solvent to remove the unpolymerized (or polymerized) microcapsules.

In the image forming method of the present invention, unpolymerized microcapsules are preferably ruptured. The unpolymerized microcapsules are usually ruptured by pressing the recording element. However, the microcapsules can also be ruptured by using ultrasonic wave or heating means.

According to the present invention, the image is more preferably transferred to an image-receiving element. After exposing to light the recording element, the element can be pressed on the image-receiving element to transfer the unpolymerized composition to the image-receiving element. The process for pressing the element can be carried out in various known manners.

In the case that the recording layer contains a color image forming substance, the color image forming substance is fixed by polymerization of the polymerizable compound. Then, pressing the recording element on the image-receiving element to transfer the unfixed color image forming substance to the image-receiving element, a color image can be produced on the image-receiving element.

The three embodiments of the image forming method of the present invention are further described below referring to the accompanying drawings.

FIG. 1 is a sectional view schematically illustrating a recording element which can be used in the first embodiment of the image forming method of the present invention.

As is shown in FIG. 1, the recording element comprises a support (11) and a recording layer (13). A polymerizable compound is contained in microcapsules (12) which are dispersed in the recording layer (13). A photopolymerization initiator (o) is arranged outside of the microcapsules (12).

FIG. 1-A is a sectional view schematically illustrating the process for heating the element.

As is shown in FIG. 1-A, the element is heated to form a photopolymerizable composition in the microcapsules (14). When the element is heated, the photopolymerization initiator (o) permeates through the shell of the microcapsules.

FIG. 1-B is a sectional view schematically illustrating the process for imagewise exposing to light the element.

As is shown in FIG. 1-B, the photopolymerizable composition contained in the microcapsules is polymerized within the exposed area (15), while the photopolymerizable composition is not polymerized within the other area (16).

FIG. 1-C is a sectional view schematically illustrating the process for pressing the element on an image-receiving element.

As is shown in FIG. 1-C, when the recording element is pressed on the image-receiving element (19), the microcapsules within the unexposed area (17) are ruptured to transfer the unpolymerized photopolymerizable composition (18) to the image-receiving element (19).

Figure 2:
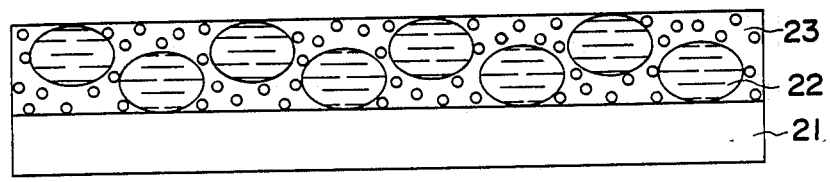
FIG. 2 is a sectional view schematically illustrating a recording element which can be used in the second embodiment of the image forming method of the present invention.
Figure 2:
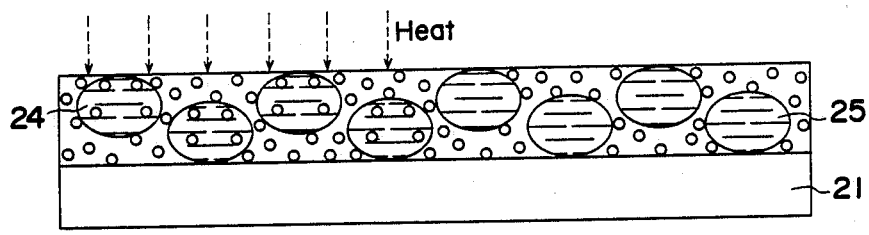
Figure 2:
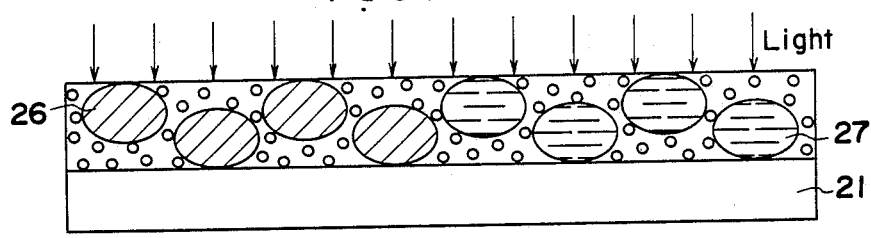
Figure 2:
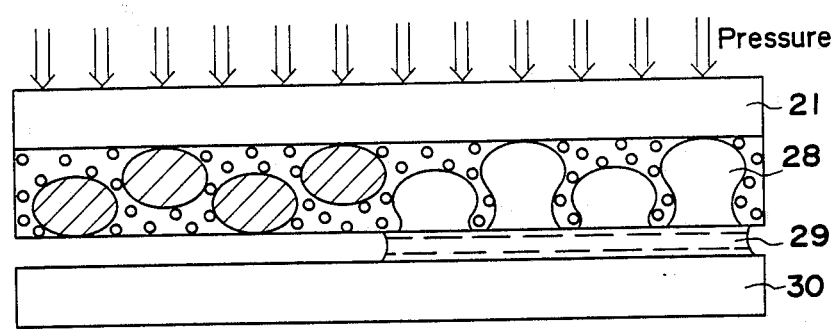

FIG. 2 is a sectional view schematically illustrating a recording element which can be used in the second embodiment of the image forming method of the present invention. The recording element shown in FIG. 2 is the same as that shown in FIG. 2.

As is shown in FIG. 2, the recording element comprises a support (21) and a recording layer (23). A polymerizable compound is contained in microcapsules (22) which are dispersed in the recording layer (23). A photopolymerization initiator (o) is arranged outside of the microcapsules (22). FIG. 2-A is a sectional view schematically illustrating the process for imagewise heating the element.

As is shown in FIG. 2-A, the element is imagewise heated to form a photopolymerizable composition in the microcapsules (24). When the element is imagewise heated, the photopolymerization initiator (o) permeates through the shell of the microcapsules (24) within the heated area. Within the unheated area, the photopolymerization initiator (o) does not permeates through the shell of the microcapsules (25).

FIG. 2-B is a sectional view schematically illustrating the process for exposing to light the element.

As is shown in FIG. 2-B, the photopolymerizable composition contained in the microcapsules within the heated area (26) is polymerized, while the polymerizable compound contained in the microcapsules within the unheated area (27) is not polymerized.

FIG. 2-C is a sectional view schematically illustrating the process for pressing the element on an image-receiving element.

As is shown in FIG. 2-C, when the recording element is pressed on the image-receiving element (30), the microcapsules within the unheated area (28) are ruptured to transfer the unpolymerized polymerizable compound (29) to the image-receiving element (30).

Figure 3:
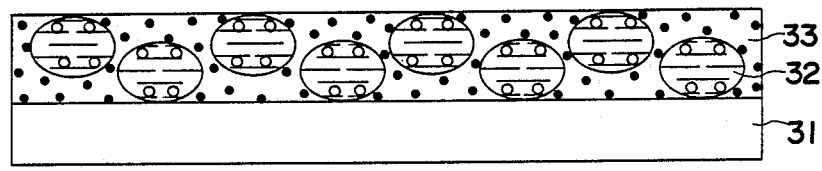
FIG. 3 is a sectional view schematically illustrating a recording element which can be used in the third embodiment of the image forming method of the present invention.
Figure 3:
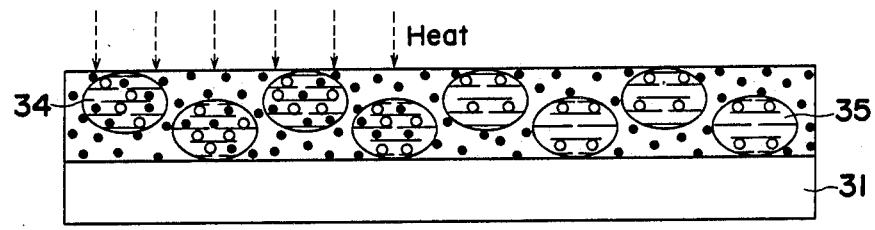
Figure 3:
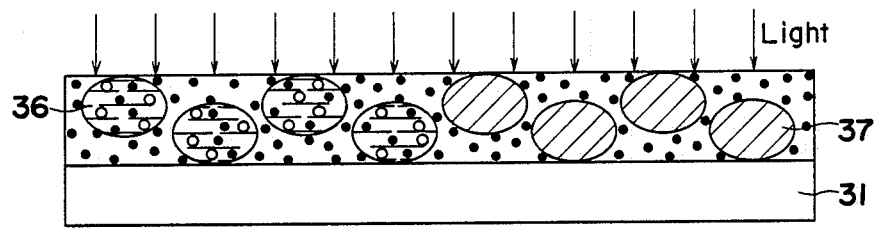
Figure 3:
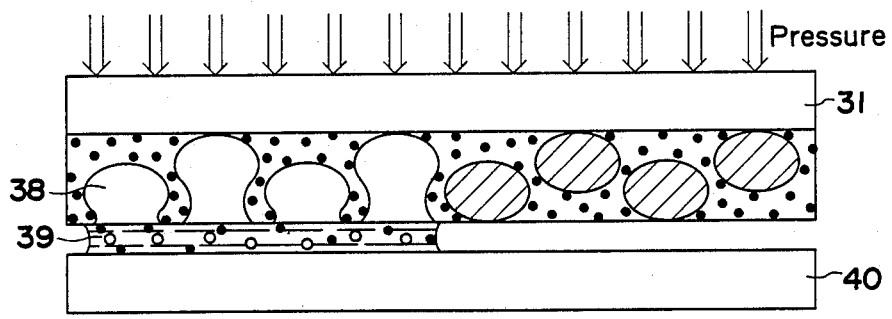
Figure 4:
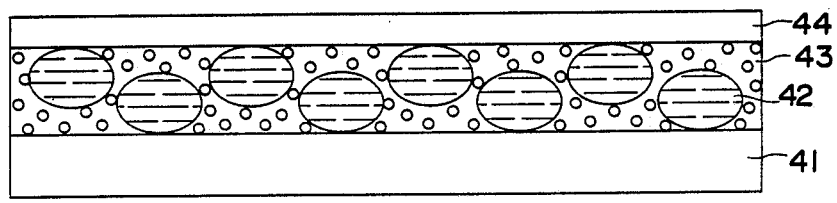
FIG. 4 is a sectional view schematically illustrating an embodiment of the photopolymerizable element disclosed in U.S. Pat. No. 4,636,453.
Figure 4:
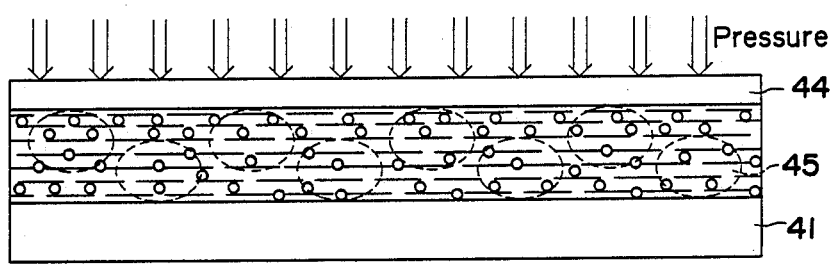
Figure 4:
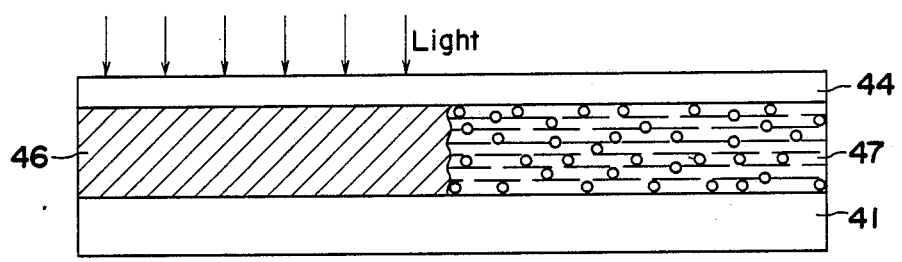
Figure 4:
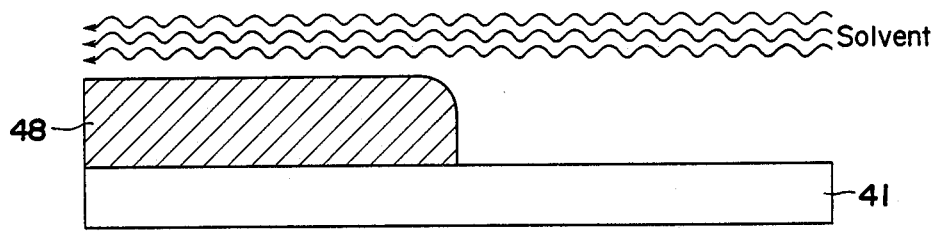

FIG. 3 is a sectional view schematically illustrating a recording element which can be used in the third embodiment of the image forming method of the present invention.

As is shown in FIG. 3, the recording element comprises a support (31) and a recording layer (32). A polymerizable compound and a photopolymerization initiator (o) are contained in microcapsules (32) which are dispersed in the recording layer (33). A polymerization inhibitor (·) is arranged outside of the microcapsules (32).

FIG. 3-A is a sectional view schematically illustrating the process for imagewise heating the element.

As is shown in FIG. 3-A, the element is imagewise heated to mix the photopolymerizable composition (comprising the polymerizable compound and the photopolymerization initiator (o)) with the polymerization inhibitor (·) in the microcapsules. When the element is imagewise heated, the polymerization inhibitor (·) permeates through the shell of the microcapsules (34) within the heated area. Within the unheated area, the polymerization inhibitor (·) does not permeates through the shell of the microcapsules (35).

FIG. 3-B is a sectional view schematically illustrating the process for exposing to light the element.

As is shown in FIG. 3-B, the photopolymerizable composition contained in the microcapsules within the heated area (36) is not polymerized, while the composition contained in the microcapsules within the unheated area (37) is polymerized.

FIG. 3-C is a sectional view schematically illustrating the process for pressing the element on an image-receiving element.

As is shown in FIG. 3-C, when the recording element is pressed on the image-receiving element (40), the microcapsules within the heated area (38) are ruptured to transfer the unpolymerized composition (39) to the image-receiving element (40).

The image forming method of the invention can be employed for a process for preparation of a lithographic plate including an image transfer process described in Japanese Patent Provisional Publications Nos. 61(1986)-193155 and 61(1986)-281242; a process for preparation of a lithographic plate including no image transfer process described in Japanese Patent Provisional Publication No. 58(1983)-224752; a process for preparation of a lithographic plate containing photopolymerizable microcapsules between a silicon rubber layer and a support described in Japanese Patent Application No. 61(1986)-29727; and a process for preparation of a lithogrpahic plate including a process in which unpolymerized microcapsules are ruptured by heating described in Japanese Patent Application No. 61(1986)-93531.

The recording elements employed for the image forming method of the invention are described below.

The first and second embodiments of the present invention use a recording element which comprises a recording layer on a support. The recording layer containing at least two active components of a photopolymerizable composition. The active components are separated from each other by the shell of microcapsules in such manner that at least one component is contained in the microcapsules which are dispersed in the recording layer and the other component is arranged outside of the microcapsules.

The photopolymerizable composition consists of at least two active components which are essential for a photopolymerization reaction. Examples of the active components include a polymerizable compound, a photopolymerization initiator (which may comprise two or more compounds), a sensitizer and an oxygen scavenger.

The photopolymerizable composition preferably comprises a polymerizable compound and a photopolymerization initiator. In this case, the components are preferably separated from each other by the shell of microcapsules in such manner that the polymerizable compound is contained in the microcapsules which are dispersed in the recording layer and the photopolymerization initiator is arranged outside of the microcapsules.

The photopolymerizable composition also preferably comprises a polymerizable compound, a photopolymerization initiator and a sensitizer. In this case, the components are preferably separated from each other by the shell of microcapsules in such manner that the polymerizable compound and photopolymerization initiator are contained in the microcapsules, and the sensitizer is arranged outside of the microcapsules.

The third embodiment of the present invention uses a new recording element which comprises a recording layer on a support. The recording layer contains a photopolymerizable composition and a polymerization inhibitor. The composition and inhibitor are separated from each other by the shell of microcapsules in such manner that one is contained in the microcapsules which are dispersed in the recording layer and the other is arranged outside of the microcapsules.

The photopolymerizable composition used in the third embodiment is the almost same as that used in the first and second embodiemnts, except that the photopolymerizable composition may consist of a single compound which has the both functions of a polymerizable compound and a photo polymerization initiator. The composition and inhibitor are preferably separated from each other by the shell of microcapsules in such manner that the composition is contained in the microcapsules which are dispersed in the recording layer and the inhibitor is arranged outside of the microcapsules.

Each of the components used in the recording element is described below.

There is no specific limitation with respect to the polymerizable compound, and any known polymerizable compounds including monomers, oligomers and polymers can be contained in the recording layer.

Preferred polymerizable compounds employable for the recording element are compounds which are polymerizable through addition reaction of ring-opening reaction. Preferred examples of the compounds being polymerizable through addition reaction include compounds having an ethylenic unsaturated group. Preferred examples of the compounds being polymerizable through ring-opening reaction include the compounds having an epoxy group. The compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compound is preferably used in a coating amount of 1 to 50 g/m², and more preferably used in a coating amount of 5 to 20 g/m².

Examples of the photopolymerization initiator include α-alkoxyphenylketones, polycyclic quinones, benzophenones, substituted benzophenones, xanthones, thioxanthones, halide compounds (e.g., chlorosulfonyl polynuclear aromatic compounds, chloromethyl polynuclear aromatic compounds, chlorosulfonylbenzophenones, chloromethylbenzophenones, fluorenones), haloalkanes, α-halo-α-phenylacetophenones, redox couples of photo reducible dye and reducing agent, paraffin halide (e.g., brominated paraffin, chlorinated paraffin), benzoyl alkyl ethers, lophine dimers, and anionic salts of organic boron compounds with organic cationic compounds (described in Japanese Patent Provisional Publication No. 62(1987)-143044).

Concrete examples of the photopolymerization initiator include 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylthioxanthone, chlorosulfonylanthraquinone, chloromethylanthracene, chloromethylbenzothiazole, chlorosulfonylbenzoxiazole, chloromethylquinoline, chloromethylbenzophenone, chlorosulfonylbenzophenone, fluorenone, carbon tetrabromide, benzoin butyl ether, benzoin isopropyl ether, a combination of 2,2'-bis(o-chlorophenyl)-4,4',5,5'-tetraphenyl-biimidazole and 4,4'-bis(diethylamino)benzophenone.

The photopolymerization initiator can be used singly or in combination of two or more compounds.

The photopolymerization initiator is preferably used in amount of 0.5 to 100 weight %, more preferably 2 to 80 weight %, based on the amount of the polymerizable compound.

A sensitizer (or sensitizing agent) is a compound which can increase the sensitivity of a recording element when it is used in combination with the photopolymerization initiator. An example of the sensitizer is a compound containing an activation hydrogen in its molecule. Concrete examples of the sensitizers include N-phenylglycine, trimethyl barbituric acid, 2-mercapto benzooxazole, 2-mercapto benzothiazole, 2-mercapto benzimidazole and a compound having the following formula (I) or (II):

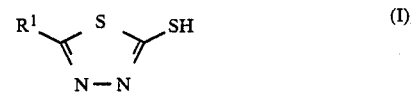

(I)

In the formula (I), $R^1$ is a monovalent group selected from the group consisting of an alkyl group, an alkylthio group and a mercapto group.

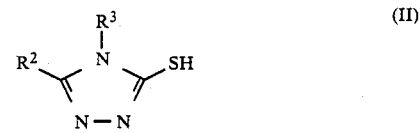

(II)

In the formula (II), $R^2$ is a monovalent group selected from the group consisting of hydrogen and an alkyl group, and $R^3$ is a monovalent group selected from the group consisting of an alkyl group and an aryl group.

In the present invention, the sensitizer is preferably used in an amount of 0.5 to 100 weight % based on the amount of the polymerizable compound, and more preferably 2 to 80 weight %.

A conventional thermal polymerization inhibitor can be used as the polymerization inhibitor in the present invention. Concrete examples of the polymerization inhibitors include p-methoxyphenol, hydroquinone, an alkyl substituted hydroquinone, an aryl substituted hydroquinone, t-butylcatechol, naphtylamine, β-naphthol, nitrobenzene, dinitrobenzene and p-toluidine.

In the third embodiment of the image forming method of the present invention, the polymerizaton inhibitor is preferably arranged outside of the microcapsules. The polymerization inhibitor is preferably used in an amount of 0.01 to 50 weight % based on the amount of the polymerizable compound, and more preferably is 1 to 30 weight %.

Examples of the oxygen scavenger include organophosphines, organophosphonates, organic phosphites and stannous salt. The oxygen trapping agent is preferably used in an amount of 1 to 50 weight % based on the amount of the polymerizable compound.

Examples of the process for the preparation of the microcapsules include a process utilizing coacervation of hydrophilic wall-forming materials as described in U.S. Pat. Nos. 2,800,457 and 2,800,458; and interfacial polymerization process as described in U.S. Pat. No. 3,287,154, U.K. Patent No. 990,443 and Japanese Patent Publications Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins, hydroxypropyl cellulose or like as a walll-forming materials as described in U.S. Pat. No. 4,025,455 an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; and a spray-drying process as described in U.S. Pat. No. 3,111,407 and U.K. Patent No. 930,422. It is preferable, though not limitative, that the microcapsule is prepared by emulsifying core materials containing the polymerizable compound and forming a polymeric membrane (i.e., shell or wall) over the core materials.

In particular, preferred effects can be obtained when encapsulation is carried out by polymerization of reactants supplied from the inside of oil droplets. Thus, the microcapsules having a uniform particle size and improved in stability can be obtained in a short time. Other component being outside of the microcapsules can be penetrated during heating.

A preferred process for the preparation of the microcapsules is performed by dissolving a polyisocyanate compound in a core material of a hydrophobic liquid; then the hydrophobic liquid is dispersed in an aqueous medium containing a polyamine compound or a polyol compound to form a dispersion containing small droplets of the hydrophobic core material, wherein the dispersion preferably contains a catalyst for accelerating polycondensation reaction between the polyisocyanate compound and a polyamine compound and/or a polyol compound; and heating the dispersion (to 40°-90° C.) to form a polyurea resin (reaction product of the polyisocyanate compound and the polyamine compound or water) and/or a polyurethane resin (reaction product of the polyisocyanate compound and the polyol compound) to give microcapsules.

The polyisocyanate, polyol and polyamine are described in U.S. Pat. Nos. 3,281,383, 3,773,695 and 3,793,268, Japanese Patent Publications Nos. 48(1973)-40347 and 49(1974)-24159, and Japanese Patent Provisional Publications Nos. 48(1973)-80191 and 48(1973)-84086.

The polyisocyanate can be a diisocyanate compound such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-4,4'-biphenyl diisocyanate, 3,3'-dimethyl-4,4'-diisocyanate, xylylene-1,4-diisocyanate, xylylene-1,3-diisocyanate, 4,4'-diphenylpropane diisocyanate, trimethylene diisocyanate, hexamethylene diisocyanate, propylene-1,2-diisocyanate, butylene-1,2-diisocyanate, ethylidyne diisocyanate, cyclohexylene-1,2-diisocyanate or cyclohexylene-1,4-diisocyanate; a triisocyanate compound such as 4,4',4''-triphenylmethane triisocyanate, toluene-2,4,6-triisocyanate or polymethylene polyphenyl triisocyanate; a tetraisocyanate compound such as 4,4'-dimehtyldiphenylmethane-2,2',5,5'-tetraisocyanate; or a polyisocyanate prepolymer such as an addition compound of hexamethylene diisocyanate and trimethylolpropane, an addition compound of 2,4-tolylene diisocyanate and trimethylolpropane, an addition compound of xylylene diisocyanate and trimethylolpropane or an addition compound of tolylene diisocyanate and hexanetriol.

The polyol compound can be an aliphatic or aromatic polyhydric alcohol, hydroxy polyester, or hydroxy polyalkylene ether.

The polyol compounds described in Japanese Patent Provisional Publication No. 60(1985)-49991 can be used. Examples of the polyol compounds include condensate of an aromatic polyhydric alcohol and alkyleneoxide such as ethylene glycol, 1,3-propanediol, 1,4-butanediol, 1,5-pentanediol, 1,6-hexanediol, 1,7-heptanediol, 1,8-octanediol, propylene glycol, 2,3-dihydroxy buthane, 1,2-dihydroxy buthane, 1,3-dihydroxy buthane, 2,2-dimethyl-1,3-propanediol, 2,4-pentanediol, 2,5-hexanediol, 3-methyl-1,5-pentanediol, 1,4-cyclohexanedimethanol, dihydroxy cyclohexane, diethylene glycol, 1,2,6-trihydroxyhexane, 2-phenylpropyleneglycol, 1,1,1-trimethylolpropane, hexanetriol, pentaerythritol, pentaerythritol ethylene oxide additive, glyceric ethylene oxide additive, glycerol, 1,4-di(2-hydroxyethoxy)-benzene, resorcinol dihydroxyethyl ether; p-xylylene glycol, m-xylylene glycol, α,α'-dihydroxy-p-diisopropylbenzene, 4,4'-dihydroxy-diphenyl methane, 2-(p,p'-dihydroxydiphenylmethyl)benzylalcohol, adduct of ethylene oxide to bisphenol A and adduct of propylene oxide to bisphenol A. The polyol compound is preferably used in an amount of 0.02 to 2 mol. of hydroxyl group per 1 mol. of isocyanate group.

The polyamine compound can be ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylaminopropylamine, tetraethylenepentamine, or an amine adduct of an epoxy compound. The polyisocyanate compound can form a polymer by reacting with water.

The water soluble polymers can be used to prepare the microcapules. The water soluble polymers may be any of anionic polymers, nonionic polymers and amphoteric polymers. The anionic polymers either natural or synthetic, include those having —COO⁻ group and —SO₃⁻ group. Concrete examples of the anionic polymers include natural polymers such as gum arabic, alginic acid and pectin; semi-synthetic polymers such as carboxymethyl cellulose, phthalated gelatin, sulfated starch, sulfated cellulose, and lignin sulfonic acid; synthetic polymers such as maleic anhydride (include a hydrolysate thereof) copolymers, acrylic (include methacrylic) polymers and copolymers, vinylbenzenesulfonic acid polymers and copolymers, and caroboxyl-modified polyvinyl alcohol.

Examples of the nonioic polymers include polyvinyl alcohol, hydroxyethyl cellulose and methyl cellulose.

Example of the amphoteric polymer is gelatin.

In the recording element, the water soluble polymer functions as a binder which is arranged outside of the microcapsules.

The water soluble polymer can be used as aqueous solution at a concentration of from 0.01 to 10 weight %.

The size of the microcapsules is usually not larger than $80\mu$. From the viewpoint of the physical stability of the microcapsules, the size of the microcapsules is preferably not larger than $20\mu$. In order to easily rupture the microcapsules in an image forming process, the microcapsules preferably have a particle size of not smaller than $0.1\mu$.

The microcapsules preferably have such a pressure characteristic that they are not ruptured at a pressure of not more than about 10 kg/cm² and ruptured at a pressure of not less than about 500 kg/cm². The pressure characteristic can be controlled depending on the particle size of the microcapsules, the thickness of the shell of the microcapsules, and the nature of the shell material.

The support used in the recording element is preferably resistant to heat or pressure given in the image forming method of the invention. Examples of the material employable as the support of the recording element include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

The recording element containing the above-mentioned components can give a polymer image. When the recording element further contains a color image forming substance as an optional component, the element can give a color image. The color image forming substance is preferably contained in the microcapsules.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977).

These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry. "The Newest Chemistry of Coloring Matter - Attractive Application and New Development as a Functional Coloring Matter", pp. 26–32 (June, 19, 1980).

The color image forming substance in the recording element is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

According to the image forming method of the invention, an image can be formed on an image-receiving element. The image-receiving element is described hereinbelow.

Examples of the material employable as the support of the image-receiving element include baryta paper in addition to the above-mentioned various examples which can be employed as the support of the recording element.

The image-receiving element is usually prepared by providing the image-receiving layer on the support. The image-receiving layer can be constructed according to the color formation system. In the cases that a polymer image is formed on the image-receiving element and that a dye or pigment is employed as the color image forming substance, the image-receiving element may be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder.

The image-receiving layer can be composed of two or more layers according to the above-mentioned functions. The thickness of the image-receiving layer preferably ranges from 1 to 100 μm, more preferably from 1 to 20 μm.

The present invention is further described by the following examples without limiting the invention.

EXAMPLE 1

Preparation of microcapsule dispersion

In 30 g of trimethylolpropane triacrylate was dissolved 3 g of a leuco dye (Pargascript Red I-6-B produced by Ciba-Geigy). To the mixture was added 12 g of an adduct of xylylene diisocyanate and trimethylolpropane (Takenate D110N produced by Takeda Chemical Industries, Ltd.). The resulting mixture was added to 130 g of 4% aqueous solution of methyl cellulose (Metholose 65SH produced by Shinetsu Chemical Industry Co., Ltd.). The mixture was then stirred at 5,000 r.p.m. for 1 minute using a homogenizer to obtain an emulsion. To the emulsion was added 20 g of 2% aqueous solution of diethylene triamine, and the mixture was stirred for 30 minutes at room temperature. The mixture further was stirred for 90 minutes at 40° C. to obtain a polyurea microcapsule dispersion containing a polymerizable compound and a leuco dye. The average particle size of the microcapsules was 8μ.

Preparation of recording element

To 95 g of 5% aqueous solution of polyvinyl alcohol (PVA 205 produced by Kuraray Co., Ltd.) was added 5 g of 2,2-dimethoxy-2-phenylacetophenone (photopolymerization initiator; Irgacure 651 produced by Ciba-Geigy), and the mixture was dispersed using Dynomill dispersing device. To 5 g of the obtained dispersion was added 5 g of the above microcapsule dispersion, and the mixture was stirred. On a paper having a basis weight of 80 g was coated the mixture in an coating amount of 70 g/m$^2$ and dried to obtain a recording element.

Preparation of image-receiving material

To 125 g of water was added 11 g of 40% aqueous solution of sodium hexametaphosphate, and were further added 34 g of zinc 3,5-di-α-methylbenzylsalicylate (developer) and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on a paper having a basis weight of 80 g to give a layer having a wet thickness of 30 μm and dried to obtain an image-receiving element.

Image formation using recording element

The recording element was heated on a hot plate at 140° C. for 20 seconds. The recording element was image-wise exposed to light using 200 W of mercury lamp from a distance of 30 cm for 2 seconds. The heated and exposed recording element was then combined with the image-receiving element and passed through a press roll under pressure of 500 kg/cm$^2$ to obtain a clear magenta positive image on the image-receiving element.

For comparison, the recording element was image-wise exposed to light without heating the element, and was then pressed on the image-receiving element. As a result, the image-receiving element was colored all over the surface, and no image was observed.

EXAMPLE 2

Preparation of microcapsule dispersion

In 6 g of methylene chloride were dissolved 0.6 g of 4,4'-bis(diethylamino)benzophenone, 1.8 g of 2,2'-bis(o-chlorophenyl)-4,4',5,5'-tetraphenylbiimidazole and 2 g of 3-diethylamino-6-chloro-7-anilinofluorane (leuco dye), and the resulting solution was added to 30 g of trimethylolpropane triacrylate. To the mixture was added 12 g of Takenate D110N, and the mixture was stirred. The resulting mixture was further added to 130 g of 4% aqueous solution of Metholose 65SH. The mixture was then stirred at 5,000 r.p.m. for 1 minute using homogenizer to obtain an emulsion. To the emulsion was added 20 g of 2% aqueous solution of diethylene triamine, and the mixture was stirred for 30 minutes at room temperature. The mixture was further stirred for 90 minutes at 40° C. to obtain a polyurea microcapsule dispersion containing a polymerizable compound, a photopolymerization initiator and a leuco dye. The average particle size of the microcapsules was 9μ.

Preparation of recording element

To 95 g of 5% aqueous solution of polyvinyl alcohol was added 5 g of 2-mercapto-5-methylthio-1,3,4-thiadiazole (sensitizer), and the mixture was dispersed using Dynomill dispersing device. To 5 g of the obtained dispersion was added 5 g of the above microcapsule dispersion, and the mixture was stirred. On a paper having a basis weight of 80 g was coated the resulting mixture in an coating amount of 70 g/m$^2$ and dried to obtain a recording element.

Image formation using recording element

The recording element was heated on a hot plate at 140° C. for 5 seconds. The recording element was then imagewise exposed to light using 200 W of mercury lamp through an ND (neutral density) filter having a density of 2.0 from a distance of 30 cm for 3 seconds. The heated and exposed recording element was then combined with the image-receiving element used in Example 1 and passed through a press roll under pressure of 500 kg/cm$^2$ to obtain a clear black positive image on the image-receiving element.

For comparison, the recording element was imagewise exposed to light throught the ND filter without heating the element, and was then pressed on the image-receiving element. As a result, the image-receiving element was colored all over the surface, and no image was observed.

Further, the recording element was directly (without the ND filter) imagewise exposed to light without heating the element, and was then pressed pressed on the image-receiving element. As a result, an image was obtained on the image-receiving element. It is apparent from the result that the sensitivity of the recording element is remarkably increased by using a sensitizer.

For another comparison, the recording element was left under 30 W of fluorescent lamp for 1 hour from a distance of 2 m before heating the element. The recording element was then heated, imagewise exposed to light, and pressed on the image-receiving material in the same manner as mentioned above. As a result, a clear black positive image was obtained on the image-receiving element. It is apparent from the result that the recording element is improved in its handling under room light.

Furthermore, the recording element was left for 50 days at room temperature. The element was then heated, imagewise exposed to light, and pressed on the image-receiving material in the same manner as mentioned above. As a result, a clear black positive image was obtained on the image-receiving element. It is apparent from the result that the the recording element is improved in the stability.

COMPARISON EXAMPLE 1

A microcapsule dispersion was prepared in the same manner as in Example 2, except that 1.2 g of 2-mercapto-5-methylthio-1,3,4-thiadiazole (sensitizer) was added to trimethylolpropane triacrylate. To 5 g of the microcapsule dispersion was added 5 g of 5% aqueous solution of polyvinyl alcohol, and the mixture was coated and dried in the same manner as in Example 2 to obtain a recording element.

The recording element was then imagewise exposed to light, and pressed on the image-receiving material in the same manner as in Example 2 to obtain a black positive image on the image-receiving element.

For comparison, the recording element was left under 30 W of fluorescent lamp for 1 hour from a distance of 2 m before heating the element. The recording element was then imagewise exposed to light, and pressed on the image-receiving material in the same manner as mentioned above. As a result, a black positive image was obtained on the image-receiving element. However, the maximum density in the image was about half of that in the image obtained in the above-mentioned process. It is apparent from the result that the recording element is fogged under room light.

Further, the recording element was left for 50 days at room temperature. The element was then imagewise exposed to light, and pressed on the image-receiving material in the same manner as memtioned above. As a result, the image-receiving element was colored all over the surface, and no image was observed.

EXAMPLE 3

On the recording element prepared in Example 2 was pressed a heated stamp at 140° C. for 5 seconds, and the element was then exposed to light all over the recording layer through ND filter having a density of 2.0 using 200 W of mercury lamp for 3 seconds from a distance of 30 cm. The heated and exposed recording element was combined with the image-receiving element and was passed through a press roll under pressure of 500 kg/cm$^2$ to obtain a clear black image on the image-receiving element. In the image, a black color was observed within the unheated area, and the color was not observed within the heated area. It is apparent from the result that the recording element can be used in a heat-sensitive image forming method.

EXAMPLE 4

Preparation of microcapsule dispersion

In 30 g of trimethylol propane triacrylate were dissolved 3 g of a leuco dye (Pargascript Red I-6-B produced by Ciba-Geigy) and 1 g of benzoin isobutyl ether. To the mixture was added 12 g of Takenate D110N, and was mixed. The resulting mixture was added to 130 g of 4% aqueous solution of Metholose 65SH, and the mixture was stirred at 5,000 r.p.m. for 1 minute to obtain an emulsion. To the emulsion was added 20 g of 2% aqueous solution of diethylene triamine, and the mixture was stirred at room temperature for 30 minutes. The mixture was further stirred at 40° C. for 90 minutes to obtain a polyurea microcapsule dispersion containing a polymerizable compound, a leuco dye and a photopolymerization initiator. The average particle size of the microcapsules was 8μ.

Preparation of recording element

To 95 g of 5% aqueous solution of polyvinyl alcohol (PVA 205 produced by Kuraray Co., Ltd.) was added 5 g of p-methoxyphenol (polymerization inhibitor), and the mixture was dispersed using Dynomile dispersing device. To 5 g of the obtained dispersion was added 5 g of the above microcapsule dispersion, and the mixture was stirred. The resulting mixture was coated on a paper having a basis weight of 80 g in a coating amount of 70 g/m$^2$ and dried to obtain a recording element.

Image formation using recording element

On the prepared recording element was pressed a heated stamp at 120° C. for 3 seconds, and the element was then exposed to light all over the recording layer using 200 W of mercury lamp for 5 seconds from a distance of 30 cm. The heated and exposed recording element was combined with the image-receiving element and was passed through a press roll under pressure of 500 kg/cm$^2$ to obtain a clear black image on the image-receiving element. In the image, a black color was observed within the eated area, and the color was not observed within the unheated area. It is apparent from the result that the recording element can be used in a heat-sensitive image forming method.

We claim:

1. An image forming method using a recording element which comprises a recording layer on a support, said recording layer containing at least two active components of a photopolymerizable composition, said components being selected from the group consisting of a polymerizable compound, a photopolymerization initiator, a sensitizer and an oxygen scavenger, and said components being separated from each other by the shell of microcapsules in such manner that at least one component is contained in the microcapsules which are dispersed in the recording layer and the other component is arranged outside of the microcapsules with the proviso that the polymerizable compound is contained only in the microcapsules, wherein the image forming method comprises the steps of:

uniformly heating the recording element at a temperature of 70° to 300° C. to bring the component outside of the microcapsules into contact with the component in the microcapsules by permeation of at least one of the components through the shell of the microcapsules without rupturing the microcapsules; and simultaneously or thereafter imagewise exposing to light the recording element to imagewise polymerize the composition.

2. The image forming method as claimed in claim 1, wherein after the recording element is imagewise exposed to light, the recording element is pressed on an image-receiving element to transfer the unpolymerized photopolymerizable composition to the image-receiving element.

3. The image forming method as claimed in claim 1, wherein the at least two active components of the photopolymerizable composition consist of a polymerizable compound and a photopolymerization initiator.

4. The image forming method as claimed in claim 1, wherein the at least two active components of the photopolymerizable composition consist of a polymerizable compound and a photopolymerization initiator, said polymerizable compound being contained in the microcapsules, and said photopolymerization initiator being arranged outside of the microcapsules.

5. The image forming method as claimed in claim 1, wherein the at least two active components of the photopolymerizable composition consist of a polymerizable compound, a photopolymerization initiator and a sensitizer.

6. The image forming method as claimed in claim 1, wherein the at least two active components of the photopolymerizable composition consist of a polymerizable compound, a photopolymerization initiator and a sensitizer, said polymerizable compound and photopolymerization initiator being contained in the microcapsules, and said sensitizer being arranged outside of the microcapsules.

7. The image forming method as claimed in claim 1, wherein the recording layer further contains a color image forming substance, said color image forming substance being contained in the microcapsules.

8. The image forming method as claimed in claim 1, wherein the shell of the microcapsules comprises a resin selected from the group consisting of a polyurea resin and a polyurethane resin.

9. The image forming method as claimed in claim 1, wherein the recording layer contains a binder, said binder being arranged outside of the microcapsules.

10. An image forming method using a recording element which comprises a recording layer on a support, said recording layer containing at least two active components of a photopolymerizable composition, said components being selected from the group consisting of a polymerizable compound, a photopolymerization initiator, a sensitizer and an oxygen scavenger, and said components being separated from each other by the shell of microcapsules in such manner that at least one component is contained in the microcapsules which are dispersed in the recording layer and the other component is arranged outside of the microcapsules with the proviso that the polymerizable compound is contained only in the microcapsules, wherein the image forming method comprises the steps of:

imagewise heating the recording element at a temperature of 70° to 500° C. to bring the component outside of the microcapsules into contact with the component in the microcapsules by permeation of at least one of the components through the shell of the microcapsules without rupturing the microcapsules; and simultaneously or thereafter uniformly exposing to light the recording element to polymerize the composition within the heated area.

11. The image forming method as claimed in claim 10, wherein after the recording element is exposed to light, the recording element is pressed on an image-receiving element to transfer the unpolymerized composition to the image-receiving element.

12. The image forming method as claimed in claim 10, wherein the at least two active components of the photopolymerizable composition consist of a polymerizable compound and a photopolymerization initiator.

13. The image forming method as claimed in claim 10, wherein the at least two active components of the photopolymerizable composition consist of a polymerizable compound and a photopolymerization initiator, said polymerizable compound being contained in the microcapsules, and said photopolymerization initiator being arranged outside of the microcapsules.

14. The image forming method as claimed in claim 10, wherein the at least two active components of the photopolymerizable composition consist of a polymerizable compound, a photopolymerization initiator and a sensitizer.

15. The image forming method as claimed in claim 10, wherein the at least two active components of the photopolymerizable composition consist of a polymerizable compound, a photopolymerization initiator and a sensitizer, said polymerizable compound and photopolymerization initiator being contained in the microcapsules, and said sensitizer being arranged outside of the microcapsules.

16. The image forming method as claimed in claim 10, wherein the recording layer further contains a color image forming substance, said color image forming substance being contained in the microcapsules.

17. The image forming method as claimed in claim 10, wherein the shell of the microcapsules comprises a resin selected from the group consisting of a polyurea resin and a polyurethane resin.

18. The image forming method as claimed in claim 10, wherein the recording layer contains a binder, said binder being arranged outside of the microcapsules.

19. An image forming method using a recording element which comprises a recording layer on a support, said recording layer containing a photopolymerizable composition and a polymerization inhibitor, said polymerization inhibitor being selected from the group consisting of p-methoxyphenol, hydroquinone, an alkyl substituted hydroquinone, an aryl substituted hydroquinone, t-butylcatechol, naphthylamine, β-naphthol, nitrobenzene, dinitrobenzene and p-toluidine, and said composition and inhibitor being separated from each other by the shell of the microcapsules in such manner that the photopolymerizable composition is contained in the microcapsules which are dispersed in the recording layer and the polymerization inhibitor is arranged outside of the microcapsules, wherein the image forming method comprises the steps of:

imagewise heating the recording element at a temperature of 70° to 500° C. to bring the polymerization inhibitor into contact with the photopolymerizable composition by permeation of at least one of the photopolymerizable or the polymerization inhibitor through the shell of the microcapsules without rupturing the microcapsules; and simultaneously or thereafter uniformly exposing to light the recording element to polymerize the photopolymerizable composition outside of the heated area.

20. The image forming method as claimed in claim 19, wherein after the recording element is exposed to light, the recording element is pressed on an image-receiving element to transfer the unpolymerized composition to the image-receiving element.

21. The image forming method as claimed in claim 1, wherein the photopolymerizable composition comprises a polymerizable compound and a photopolymerization initiator.

22. The image forming method as claimed in claim 21, wherein the photopolymerizable composition comprises a polymerizable compound, a photopolymerization initiator and a sensitizer.

23. The image forming method as claimed in claim 21, wherein the recording layer contains a color image forming substance, said color image forming substance being contained in the microcapsules.

24. The image forming method as claimed in claim 21, wherein the shell of the microcapsules comprises a resin selected from the group consisting of a polyurea resin and a polyurethane resin.

25. The image forming method as claimed in claim 21, wherein the recording layer contains a binder, said binder being arranged outside of the microcapsules.

26. A recording element which comprises a recording layer on a support, wherein the recording layer contains a photopolymerizable composition and a polymerization inhibitor, said polymerization inhibitor being selected from the group consisting of p-methoxyphenol, hydroquinone, an alkyl substituted hydroquinone, an aryl substituted hydroquinone, t-butylcatechol, naphthylamine, β-naphthol, nitrobenzene, dinitrobenzene and p-toluidine, said composition and inhibitor being separated from each other by the shell of microcapsules in such manner that the photopolymerizable composition is contained in the microcapsules which are dispersed in the recording layer and the polymerization inhibitor is arranged outside of the microcapsules.

27. The recording element as claimed in claim 26, wherein the photopolymerizable composition comprises a polymerizable compound and a photopolymerization initiator.

28. The recording element as claimed in claim 26, wherein the photopolymerizable composition comprises a polymerizable compound, a photopolymerization initiator and a sensitizer.

29. The recording element as claimed in claim 26, wherein the recording layer contains a color image forming substance, said color image forming substance being contained in the microcapsules.

30. The recording element as claimed in claim 26, wherein the shell of the microcapsules comprises a resin selected from the group consisting of a polyurea resin and a polyurethane resin.

31. The recording element as claimed in claim 26, wherein the recording layer contains a binder, said binder being arranged outside of the microcapsules.

32. The image forming method as claimed in claim 21, wherein the polymerization inhibitor is contained in the recording layer in an amount of 0.01 to 50 weight % based on the amount of the polymerizable compound.

33. The recording element as claimed in claim 27, wherein the polymerization inhibitor is contained in the recording layer in an amount of 0.01 to 50 weight % based on the amount of the polymerizable compound.

* * * * *